(12) United States Patent
Liu et al.

(10) Patent No.: US 10,453,966 B2
(45) Date of Patent: Oct. 22, 2019

(54) OXIDE THIN FILM TRANSISTOR DISPLAY SUBSTRATE, MANUFACTURING METHOD THEREOF, AND DISPLAY DEVICE

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventors: Xiaowei Liu, Beijing (CN); Fanqing Meng, Beijing (CN); Yang Wang, Beijing (CN); Yabin An, Beijing (CN); Zhiyong Fan, Beijing (CN); Chenglong Wu, Beijing (CN)

(73) Assignees: BOE TECHNOLOGY GROUP CO., LTD., Beijing (CN); FUZHOU BOE OPTOELECTRONICS TECHNOLOGY CO., LTD., Fuzhou, Fujian (CN)

( * ) Notice: Subject to any disclaimer, the term of this patent is extended or adjusted under 35 U.S.C. 154(b) by 0 days.

(21) Appl. No.: 15/971,089

(22) Filed: May 4, 2018

(65) Prior Publication Data
US 2019/0123206 A1    Apr. 25, 2019

(30) Foreign Application Priority Data

Oct. 19, 2017   (CN) .......................... 2017 1 0977057

(51) Int. Cl.
*H01L 29/00*    (2006.01)
*H01L 27/00*    (2006.01)
(Continued)

(52) U.S. Cl.
CPC ........ *H01L 29/7869* (2013.01); *G02F 1/1368* (2013.01); *G02F 1/136286* (2013.01);
(Continued)

(58) Field of Classification Search
CPC .............. H01L 27/1262; H01L 27/124; H01L 27/1225; H01L 27/1248; H01L 27/3262; H01L 27/3244; H01L 29/7869; H01L 29/78609; H01L 29/1225; H01L 29/4908; H01L 29/786; G02F 1/136286; G02F 1/1368; G02F 1/134309; G02F 1/13439; G02F 2201/121; G02F 2201/123
See application file for complete search history.

(56) References Cited

U.S. PATENT DOCUMENTS 9,184,187 B2 * 11/2015 Chiang ............... H01L 29/7869
9,627,546 B2 *  4/2017 Wang ................... H01L 29/7869
(Continued)

FOREIGN PATENT DOCUMENTS

CN    104064473 A    9/2014
CN    104600079 A    5/2015
(Continued)

OTHER PUBLICATIONS

First Office Action for Chinese Application No. 201710977057.0, dated Jul. 19, 2019, 7 Pages.

*Primary Examiner* — Nikolay K Yushin
(74) *Attorney, Agent, or Firm* — Brooks Kushman P.C.

(57) ABSTRACT

The present disclosure provides in some embodiments an oxide TFT display substrate, a manufacture method thereof and a display device. The oxide TFT display substrate includes a first region at least corresponding to a semiconducting region of an oxide TFT and a second region other than the first region. The method includes steps of: forming, after the formation of the oxide TFT, a SiON layer at least covering the first region; and forming a SiNx layer covering the second region.

17 Claims, 2 Drawing Sheets

(51) Int. Cl.
*G02F 1/1368* (2006.01)
*H01L 29/786* (2006.01)
*H01L 27/12* (2006.01)
*G02F 1/1362* (2006.01)

(52) U.S. Cl.
CPC ........ *H01L 27/124* (2013.01); *H01L 27/1262* (2013.01); *H01L 29/78609* (2013.01); *G02F 2201/121* (2013.01); *G02F 2201/123* (2013.01)

(56) References Cited

U.S. PATENT DOCUMENTS

| | | |
|---|---|---|
| 2010/0163874 A1 | 7/2010 | Koyama et al. |
| 2010/0301328 A1 | 12/2010 | Yamazaki et al. |
| 2015/0214257 A1* | 7/2015 | Chiang ............... H01L 29/7869 438/104 |
| 2015/0243688 A1 | 8/2015 | Lee et al. |
| 2016/0035894 A1* | 2/2016 | Wang ................ H01L 29/7869 257/43 |
| 2016/0187688 A1 | 6/2016 | Wen |
| 2017/0179424 A1* | 6/2017 | Lee .................... H01L 51/0097 |
| 2017/0273624 A1* | 9/2017 | Liu ........................ A61B 5/01 |
| 2018/0069033 A1 | 3/2018 | Chen |

FOREIGN PATENT DOCUMENTS

| | | |
|---|---|---|
| CN | 104867931 A | 8/2015 |
| CN | 105655353 A | 6/2016 |
| CN | 106887458 A | 6/2017 |
| CN | 107248516 A | 10/2017 |

\* cited by examiner

OXIDE THIN FILM TRANSISTOR DISPLAY SUBSTRATE, MANUFACTURING METHOD THEREOF, AND DISPLAY DEVICE

CROSS-REFERENCE TO RELATED APPLICATION

This application claims priority to Chinese Patent Application No. 201710977057.0 filed on Oct. 19, 2017, which is incorporated herein by reference in its entirety.

TECHNICAL FIELD

The present disclosure relates to the field of display technology, in particular to an oxide thin film transistor (TFT) display substrate, a manufacturing method thereof, and a display device.

BACKGROUND

Due to such advantages as low power consumption and narrow bezel, a market share of oxide TFT display substrates becomes higher and higher. However, an oxide TFT is very sensitive to moisture and $H^+$ in the air, and oxygen in an oxide semiconductor may react with the moisture and the free-state $H^+$. At this time, the oxide semiconductor may become a conducting region, and the TFT may fail as a switch, so a display defect may be adversely affected.

Usually, in the related art an insulation layer of the oxide TFT is made of SiNx or SiON. The SiNx layer is dense and has an excellent insulation property, so it has an excellent ability of blocking moisture and free-state ions such as $Na^+$ and $K^+$. However, the SiNx layer contains a large number of free-state $H^+$, which may be easily diffused into a semiconducting region of the TFT, so the TFT may fail as a switch, and the yield of the oxide TFT display substrate may be significantly adversely affected. Although without any free-state $H^+$, the SiON layer is loose and its ability of blocking the moisture and the free-state ions such as $Na^+$ and $K^+$ is very weak, i.e., the moisture and the free-state ions such as $Na^+$ and $K^+$ may easily enter layers of the oxide TFT display substrate. At this time, the properties of a pixel electrode and the TFT as well as the display effect may be adversely affected. In a word, the yield of the conventional oxide TFT display substrate is relatively low.

SUMMARY

In one aspect, the present disclosure provides in some embodiments a method for manufacturing an oxide TFT display substrate. The oxide TFT display substrate includes a first region at least corresponding to a semiconducting region of an oxide TFT and a second region other than the first region. The method includes steps of: forming, after the formation of the oxide TFT, a SiON layer at least covering the first region; and forming a SiNx layer covering the second region.

In a possible embodiment of the present disclosure, the step of forming the SiON layer at least covering the first region includes forming the SiON layer covering both the first region and the second region.

In a possible embodiment of the present disclosure, prior to the step of forming the SiNx layer covering the second region, the method further includes forming a first via-hole having a depth greater than a predetermined threshold in the oxide TFT display substrate, and the SiNx layer is filled into the first via-hole in the meantime of forming the SiNx layer covering the second region.

In a possible embodiment of the present disclosure, the method includes: providing a base substrate with the oxide TFTs and one or more common electrode lines, each of the oxide TFTs including a gate electrode, a gate insulation layer, an active layer, a source electrode and a drain electrode sequentially formed on the base substrate, an orthogonal projection of the active layer onto the base substrate falling within an orthogonal projection of the gate electrode onto the base substrate, the one or more common electrode lines being arranged at a layer identical to the gate electrode and being of a slit-like shape; forming a passivation layer covering the oxide TFTs and comprising SiON layer; forming a pixel electrode and a common electrode on the passivation layer, the common electrode being connected to the one or more common electrode lines through the first via-hole penetrating through the gate insulation layer and the passivation layer, the pixel electrode being connected to the drain electrode through a second via-hole penetrating through the passivation layer; applying a photoresist onto the base substrate with the pixel electrode and the common electrode, and exposing a portion of the photoresist not shielded by the gate electrode from a side of the base substrate away from the oxide TFTs; developing the photoresist so as to remove the portion of the photoresist not shielded by the gate electrode and reserve a portion of the photoresist shielded by the gate electrode; depositing the SiNx layer, a portion of the first via-hole being filled with the SiNx layer; and removing the remaining photoresist and the SiNx layer on the remaining photoresist.

In a possible embodiment of the present disclosure, the SiNx layer is deposited at a temperature of less than 250° C.

In another aspect, the present disclosure provides in some embodiments an oxide TFT display substrate, including: a first region at least corresponding to a semiconducting region of an oxide TFT and a second region other than the first region; a SiON layer arranged on the oxide TFT and at least covering the first region; and a SiNx layer arranged on the SiON layer and covering the second region.

In a possible embodiment of the present disclosure, the SiON layer covers both the first region and the second region.

In a possible embodiment of the present disclosure, a first via-hole having a depth greater than a predetermined threshold is formed in the oxide TFT display substrate, and a portion of the first via-hole is filled with the SiNx layer.

In a possible embodiment of the present disclosure, the oxide TFT display substrate includes: the oxide TFTs and one or more common electrode lines arranged on a base substrate, each of the oxide TFTs including a gate electrode, a gate insulation layer, an active layer, a source electrode and a drain electrode sequentially formed on the base substrate, an orthogonal projection of the active layer onto the base substrate falling within an orthogonal projection of the gate electrode onto the base substrate, the one or more common electrode lines being arranged at a layer identical to the gate electrode and being of a slit-like shape; a passivation layer covering the oxide TFTs and including the SiON layer; a pixel electrode and a common electrode arranged on the passivation layer, the common electrode being connected to the one or more common electrode lines through the first via-hole penetrating through the gate insulation layer and the passivation layer, the pixel electrode being connected to the drain electrode through a second via-hole penetrating through the passivation layer; and the SiNx layer arranged on the passivation layer, an orthogonal projection of the SiNx layer onto the base substrate not overlapping the orthogonal projection of the gate electrode onto the base substrate.

In a possible embodiment of the present disclosure, an organic resin layer made of an organic photosensitive material and having a thickness of about 4000 Å to 30000 Å is coated onto the passivation layer, and then exposed and developed, so as to form a pattern of the passivation layer with the first via-hole and the second via-hole through a single etching process.

In a possible embodiment of the present disclosure, an organic resin layer having a thickness of about 4000 Å to 30000 Å and made of benzocyclobutene (BCB) is coated onto the passivation layer, and then exposed and developed, so as to form a pattern of the passivation layer with the first via-hole and the second via-hole through a single etching process.

In a possible embodiment of the present disclosure, the passivation layer further includes a SiOx layer arranged between the oxide TFTs and the SiON layer.

In yet another aspect, the present disclosure provides in some embodiments a display device including the above-mentioned oxide TFT display substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate parts of the embodiments of the present disclosure, but shall not be construed as limiting the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments.

Due to such advantages as low power consumption and narrow bezel, a market share of oxide TFT display substrates becomes higher and higher. However, an oxide TFT is very sensitive to moisture and $H^+$ in the air, and oxygen in an oxide semiconductor may react with the moisture and the free-state $H^+$. At this time, the oxide semiconductor may become a conducting region, and the TFT may fail as a switch, so a display defect may be adversely affected.

Figure 1:
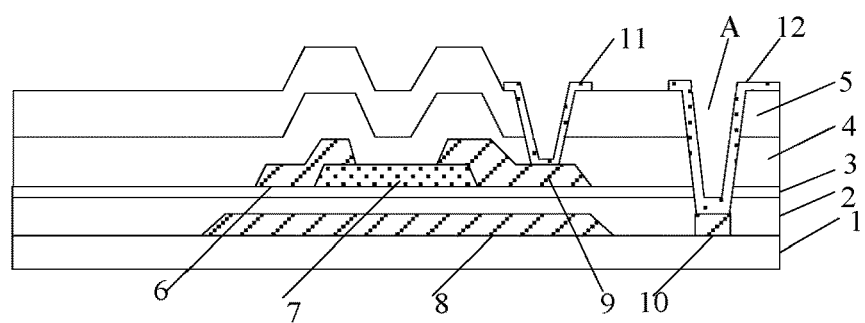
FIG. 1 and FIG. 2 are schematic views showing a conventional oxide TFT display substrate.

Usually, in the related art, an insulation layer of the oxide TFT is made of SiNx or SiON. As shown in FIG. 1, a conventional oxide TFT display substrate includes a SiON layer 5 as the insulation layer. The oxide TFT display substrate includes an oxide TFT arranged on a base substrate 1, and the oxide TFT includes a gate electrode 8, a gate insulation layer, an active layer 7, a source electrode 6 and a drain electrode 9. To be specific, the gate insulation layer includes a SiOx layer 3 and a SiNx layer 2, and the active layer is made of an oxide semiconducting material. A passivation layer covers the oxide TFT and includes a SiOx layer 4 and the SiON layer 5. A common electrode 12 and a pixel electrode 11 are formed on the passivation layer. The pixel electrode 11 is connected to the drain electrode 9 through a via-hole penetrating through the passivation layer, and the common electrode 12 is connected to a common electrode line 10 through a via-hole marked out by "A" penetrating through the passivation layer and the gate insulation layer. It can be seen that, the via-hole A shown in FIG. 1 has a relatively large depth. Although without any free-state $H^+$, the SiON layer 5 is loose and its ability of blocking moisture and free-state ions such as $Na^+$ and $K^+$ is very weak, i.e., the moisture and the free-state ions such as $Na^+$ and $K^+$ may easily enter layers of the oxide TFT display substrate. At this time, properties of the pixel electrode and the TFT as well as a display effect may be adversely affected. In addition, a significantly large segment difference occurs due to the large depth of the via-hole A, and in the case of a subsequent celling process, polyimide (PI) may be diffused unevenly. As a result, the yield of the display substrate may be significantly adversely affected.

Figure 2:
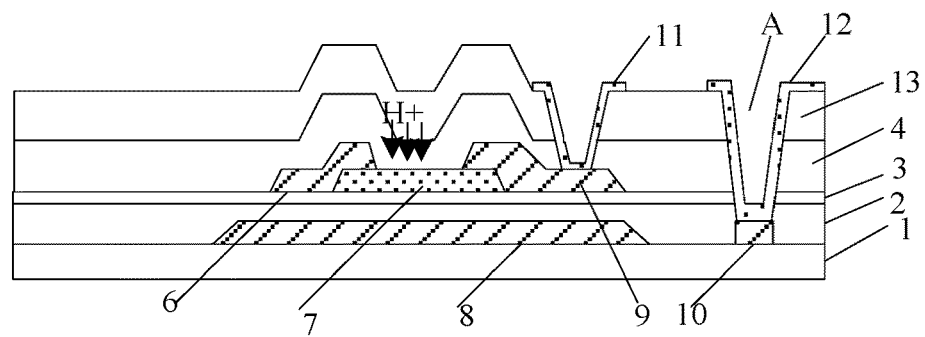

As shown in FIG. 2, another conventional oxide TFT display substrate includes a SiNx layer 13 as the insulation layer. The oxide TFT display substrate includes an oxide TFT arranged on the base substrate 1, and the oxide TFT includes the gate electrode 8, the gate insulation layer, the active layer 7, the source electrode 6 and the drain electrode 9. To be specific, the gate insulation layer includes the SiOx layer 3 and the SiNx layer 2, and the active layer is made of an oxide semiconducting material. The passivation layer covers the oxide TFT and includes the SiOx layer 4 and the SiNx layer 13. The common electrode 12 and the pixel electrode 11 are formed on the passivation layer. The pixel electrode 11 is connected to the drain electrode 9 through the via-hole penetrating through the passivation layer, and the common electrode 12 is connected to the common electrode line 10 through the via-hole marked out by "A" penetrating through the passivation layer and the gate insulation layer. It can be seen that, the via-hole A as shown in FIG. 2 has a relatively large depth. The SiNx layer 13 is dense and has an excellent insulation property, so it has an excellent ability of blocking the moisture and the free-state ions such as $Na^+$ and $K^+$. However, the SiNx layer 13 contains a large number of free-state $H^+$, which may be easily diffused into a semiconducting region of the TFT, so the TFT may fail as a switch, and the yield of the oxide TFT display substrate may be significantly adversely affected. In addition, a significantly large segment difference occurs due to the large depth of the via-hole A, and in the case of a subsequent celling process, PI may be diffused unevenly. As a result, the yield of the display substrate may be significantly adversely affected.

An object of the present disclosure is to provide an oxide TFT display substrate, a manufacturing method thereof and a display device, so as to improve the yield of the oxide TFT display substrate.

The present disclosure provides in some embodiments a method for manufacturing an oxide TFT display substrate. The oxide TFT display substrate includes a first region at least corresponding to a semiconducting region of an oxide TFT and a second region other than the first region. The method includes steps of: forming, after the formation of the oxide TFT, a SiON layer at least covering the first region; and forming a SiNx layer covering the second region.

According to the method in the embodiments of the present disclosure, the SiON layer rather than the SiNx layer covers a semiconducting region of the oxide TFT, so it is able to prevent $H^+$ ions in the SiNx layer from being diffused into an active layer of the oxide TFT, and prevent the active layer of the oxide TFT from being turned into a conductor.

In addition, the SiNx layer covers the region other than the semiconducting region. The SiNx layer is dense and has an excellent insulation property, so it has an excellent ability of blocking moisture and free-state ions such as $Na^+$ and $K^+$. As a result, it is able to ensure properties of the oxide TFT and improve the yield of the oxide TFT display substrate.

In a possible embodiment of the present disclosure, the step of forming the SiON layer at least covering the first region includes forming the SiON layer covering both the first region and the second region. In other words, the SiON layer may cover the entire display substrate.

In a possible embodiment of the present disclosure, prior to the step of forming the SiNx layer covering the second region, the method further includes forming a first via-hole having a depth greater than a predetermined threshold in the oxide TFT display substrate, and the SiNx layer is filled into the first via-hole in the meantime of forming the SiNx layer covering the second region. In this way, the SiNx layer may be filled into the via-hole in the oxide TFT display substrate, so as to reduce a segment difference of the oxide TFT display substrate, thereby to prevent PI from being diffused unevenly due to the segment difference.

The method for manufacturing the oxide TFT display substrate will be described hereinafter in more details in conjunction with the drawings and embodiments. The method may include the following steps.

Figure 3:
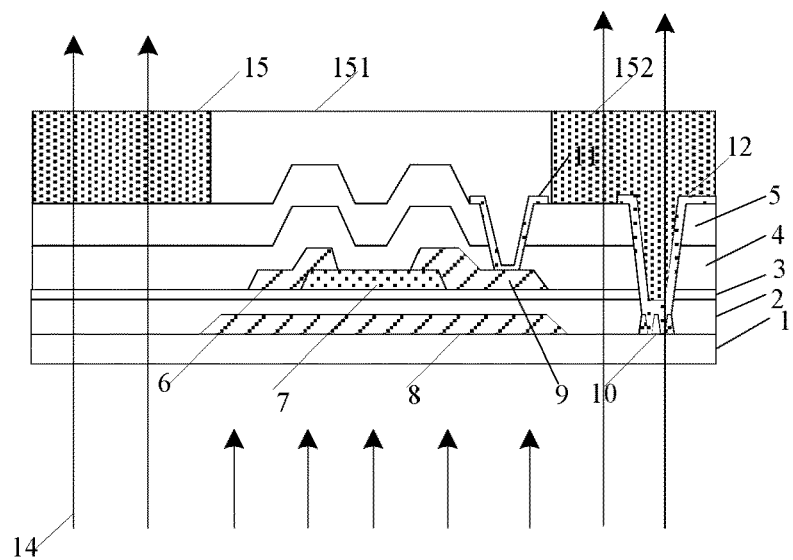
FIG. 3 through FIG. 6 are schematic views showing an oxide TFT display substrate according to embodiments of the present disclosure.

Step 1: providing a base substrate 1 with the oxide TFTs and one or more common electrode lines 10. As shown in FIG. 3, each of the oxide TFTs and the one or more common electrode lines 10 are formed on the base substrate 1. The oxide TFT includes a gate electrode 8, a gate insulation layer, an active layer 7, a source electrode 6 and a drain electrode 9. The gate insulation layer includes a SiOx layer 3 and the SiNx layer 2. An orthogonal projection of the active layer 7 onto the base substrate 1 falls within an orthogonal projection of the gate electrode 8 onto the base substrate 1. The common electrode line 10 is arranged at a layer identical to the gate electrode 8 and is of a slit-like shape.

Step 2: forming a passivation layer covering the oxide TFTs on the base substrate 1 acquired after Step 1. The passivation layer includes the SiON layer 5. In the case that the SiON layer 5 is in contact with the semiconducting region of the oxide TFTs, the semiconducting region may easily become a conducting region. Hence, the passivation layer further includes a SiOx layer 4 arranged between the oxide TFTs and the SiON layer 5.

To be specific, the SiOx layer 4 may be formed on the base substrate 1 acquired after Step 1 through plasma enhanced chemical vapor deposition (PECVD), and then the SiON layer 5 may be formed on the SiOx layer 4 through PECVD.

Next, an organic resin layer made of BCB or any other organic photosensitive material and having a thickness of about 4000 Å to 30000 Å may be coated onto the passivation layer, and then exposed and developed, so as to form a pattern of the passivation layer with the first via-hole and a second via-hole through a single etching process. To be specific, the first via-hole is formed above the common electrode lines 10, so as to expose the common electrode lines 10. The second via-hole is formed above the drain electrode 9, so as to expose the drain electrode 9.

Step 3: forming a pixel electrode 11 and a common electrode 12 on the passivation layer. The common electrode 12 is connected to the common electrode lines 10 through the first via-hole penetrating through the gate insulation layer and the passivation layer, and the pixel electrode 11 is connected to the drain electrode 9 through the second via-hole penetrating through the passivation layer.

To be specific, a transparent conductive layer made of indium tin oxide (ITO), indium zinc oxide (IZO) or any other transparent metal oxide may be deposited onto the passivation layer through sputtering or thermal evaporation. Next, a photoresist may be applied onto the transparent conductive layer, and then exposed with a mask plate, so as to form a photoresist unreserved region and a photoresist reserved region. The photoresist reserved region corresponds to a region where patterns of the pixel electrode 11 and the common electrode 12 are located, and the photoresist unreserved region corresponds to the other region. Next, the photoresist may be developed, so as to fully remove the photoresist at the photoresist unreserved region, and maintain a thickness of the photoresist at the photoresist reserved region. Next, the transparent conductive layer at the photoresist unreserved region may be fully etched off through an etching process, and the remaining photoresist may be removed, so as to form the patterns of the pixel electrode 11 and the common electrode 12.

Step 4: as shown in FIG. 3, applying a photoresist 15 onto the base substrate 1 with the pixel electrode 11 and the common electrode 12, and exposing a portion of the photoresist 15 not shielded by the gate electrode 8 from a side of the base substrate 1 away from the oxide TFTs.

As shown in FIG. 3, the photoresist may be exposed with an ultraviolet light beam 14 from the side of the base substrate 1 away from the oxide TFTs. Due to the gate electrode 8, the ultraviolet light beam 14 is shielded, so as to form an unexposed photoresist 151. A portion of the photoresist not shielded by the gate electrode 8 is exposed, so as to form an exposed photoresist 152. In addition, each of the common electrode lines 10 is of the slit-like shape, so the ultraviolet light beam 14 may pass through the first via-hole due to diffraction, so as to expose the photoresist at the first via-hole. Through the exposing with the gate electrode of the oxide TFT as a mask plate, it is unnecessary to provide a specific mask plate, thereby to reduce the manufacture cost of the oxide TFT display substrate.

Figure 4:
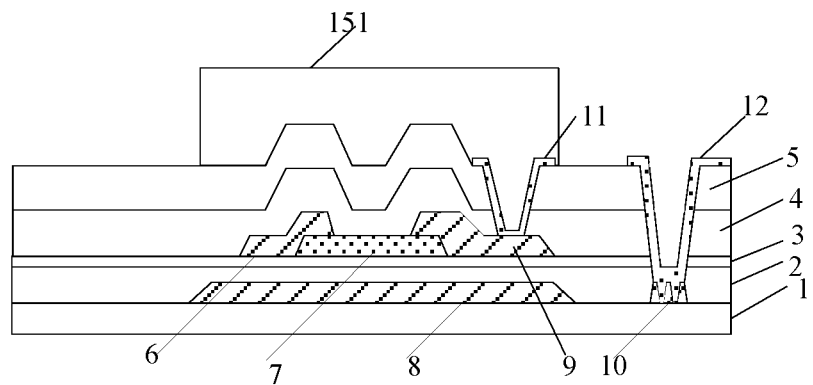

Step 5: as shown in FIG. 4, developing the photoresist, so as to remove the portion of the photoresist not shielded by the gate electrode 8 and reserve the portion of the photoresist shielded by the gate electrode 8.

As shown in FIG. 4, the exposed substrate may be developed, so as to reserve the unexposed photoresist 151 and remove the exposed photoresist 152.

Figure 5:
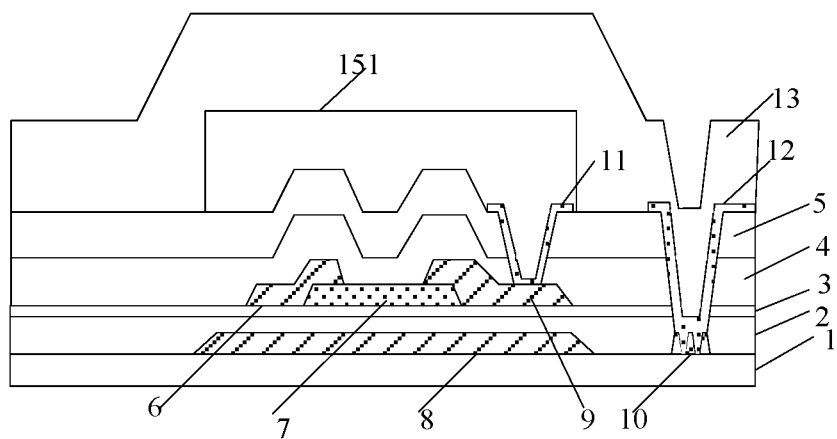

Step 6: as shown in FIG. 5, depositing the SiNx layer 13. A portion of the first via-hole may be filled with the deposited SiNx layer 13. In the case of depositing the SiNx layer 13, a low-temperature deposition process needs to be adopted, i.e., a film-forming temperature needs to be less than 250° C., so as to prevent the remaining photoresist from being volatilized, thereby to prevent a manufacture device from being polluted.

Figure 6:
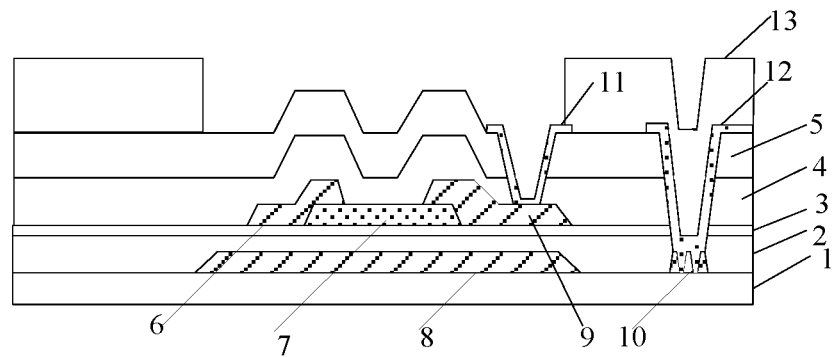

Step 7: as shown in FIG. 6, removing the remaining photoresist and a portion of the SiNx layer 13 thereon, and reserving a portion of the SiNx layer 13 not located on the photoresist.

Through the above Steps 1 to 7, due to the gate electrode 8, no SiNx layer 13 is located right above the semiconducting region of the oxide TFT display substrate, so the semiconducting region may not be turned into a conducting region due to the diffusion of the $H^+$ ions in the SiNx layer 13 into the semiconducting region. The SiNx layer 13 at the other positions may be reserved, so as to protect the oxide TFT display substrate. In addition, the SiNx layer 13 in the via-hole may also be reserved, so as to prevent PI from being diffused unevenly due to the segment difference.

In the embodiments of the present disclosure, the exposing process is performed using the gate electrode of the oxide TFT as a mask plate, so it is unnecessary to provide a specific mask plate, thereby to reduce the manufacture cost of the oxide TFT array substrate.

Surely, different from the use of the gate electrode of the oxide TFT as a mask plate, a specific mask plate may also be used after the application of the photoresist onto the base substrate 1 with the pixel electrode 11 and the common electrode 12, so as to expose the photoresist from a side of the base substrate where the oxide TFTs are formed, thereby to form the photoresist unreserved region and the photoresist reserved region. To be specific, the photoresist reserved region corresponds to the semiconducting region of the oxide TFT, and the photoresist unreserved region corresponds to the other region. Next, the photoresist may be developed, so as to fully remove the photoresist at the photoresist unreserved region and maintain a thickness of the photoresist at the photoresist reserved region. Next, the SiNx layer may be deposited, and the remaining photoresist and the SiNx layer at the photoresist reserved region may be removed, so that the resultant SiNx layer does not cover the semiconducting region of the oxide TFT.

In a possible embodiment of the present disclosure, the SiNx layer may be deposited onto the base substrate 1 with the pixel electrode 11 and the common electrode 12, the photoresist may be applied onto the SiNx layer, and then the photoresist may be exposed using a specific mask plate from the side of the base substrate where the oxide TFTs are located, so as to form the photoresist unreserved region and the photoresist reserved region. To be specific, the photoresist unreserved region corresponds to the semiconducting region of the oxide TFT, and the photoresist reserved region corresponds to the other region. Next, the photoresist may be developed, so as to fully removed the photoresist at the photoresist unreserved region and maintain a thickness of the photoresist at the photoresist reserved region. Next, the SiNx layer at the photoresist unreserved region may be fully etched off through an etching process, and the remaining photoresist may be removed, so that the resultant SiNx layer does not cover the semiconducting region of the oxide TFT.

The present disclosure further provides in some embodiments an oxide TFT display substrate which includes: a first region at least corresponding to a semiconducting region of an oxide TFT and a second region other than the first region; a SiON layer arranged on the oxide TFT and at least covering the first region; and a SiNx layer arranged on the SiON layer and covering the second region.

According to the oxide TFT display substrate in the embodiments of the present disclosure, the SiON layer rather than the SiNx layer covers a semiconducting region of the oxide TFT, so it is able to prevent $H^+$ ions in the SiNx layer from being diffused into an active layer of the oxide TFT, and prevent the active layer of the oxide TFT from being turned into a conductor. In addition, the SiNx layer covers the region other than the semiconducting region. The SiNx layer is dense and has an excellent insulation property, so it has an excellent ability of blocking moisture and free-state ions such as $Na^+$ and $K^+$. As a result, it is able to ensure properties of the oxide TFT and improve the yield of the oxide TFT display substrate.

In a possible embodiment of the present disclosure, the SiON layer may cover the first region and the second region, i.e., cover the entire display substrate.

In a possible embodiment of the present disclosure, a first via-hole having a depth greater than a predetermined threshold is formed in the oxide TFT display substrate, and a portion of the first via-hole is filled with the SiNx layer. In this way, the SiNx layer may be filled into the via-hole in the oxide TFT display substrate, so as to reduce a segment difference of the oxide TFT display substrate, thereby to prevent PI from being diffused unevenly due to the segment difference.

In a possible embodiment of the present disclosure, as shown in FIG. 6, the oxide TFT display substrate may include: the oxide TFTs and one or more common electrode lines 10 arranged on a base substrate 1, each of the oxide TFTs including a gate electrode 8, a gate insulation layer, an active layer 7, a source electrode 6 and a drain electrode 9 sequentially formed on the base substrate 1, an orthogonal projection of the active layer 7 onto the base substrate 1 falling within an orthogonal projection of the gate electrode 8 onto the base substrate 1, each of the common electrode lines 10 being arranged at a layer identical to the gate electrode 8 and being of a slit-like shape; a passivation layer covering the oxide TFTs and including the SiON layer 5; a pixel electrode 11 and a common electrode 12 arranged on the passivation layer, the common electrode 12 being connected to the common electrode line 10 through the first via-hole penetrating through the gate insulation layer and the passivation layer, the pixel electrode 11 being connected to the drain electrode 9 through a second via-hole penetrating through the passivation layer; and the SiNx layer 13 arranged on the passivation layer, an orthogonal projection of the SiNx layer 13 onto the base substrate 1 not overlapping the orthogonal projection of the gate electrode 8 onto the base substrate 1.

To be specific, the gate insulation layer may include a SiOx layer 3 and a SiNx layer 2. Through the SiOx layer 3, it is able to prevent the SiNx layer 2 from being in contact with the semiconducting region of the oxide TFT, thereby to prevent the $H^+$ ions in the SiNx layer 2 from being diffused into the semiconducting region of the oxide TFT.

In the case that the SiON layer 5 is in contact with the semiconducting region of the oxide TFT, the semiconducting region may easily become a conducting region. Hence, the passivation layer further includes a SiOx layer 4 arranged between the oxide TFTs and the SiON layer 5.

The present disclosure further provides in some embodiments a display device including the above-mentioned oxide TFT display substrate. The display device may be any product or member having a display function, e.g., a liquid crystal television, a liquid crystal display (LCD), a digital photo frame, a mobile phone or a flat-panel computer. To be specific, the display device may further include a flexible circuit board, a printed circuit board and a back plate.

In the embodiments of the present disclosure, the order of the steps is not limited to the serial numbers thereof. For a person skilled in the art, any change in the order of the steps shall also fall within the scope of the present disclosure if without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other substrate, or an intermediate element may be arranged therebetween.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing an oxide thin film transistor (TFT) display substrate, the oxide TFT display substrate comprising a first region at least corresponding to a semiconducting region of an oxide TFT and a second region other than the first region, the method comprising:
    providing a base substrate with the oxide TFT and one or more common electrode lines, the oxide TFT including a gate electrode, a gate insulation layer, an active layer, a source electrode and a drain electrode sequentially formed on the base substrate, an orthogonal projection of the active layer onto the base substrate falling within an orthogonal projection of the gate electrode onto the base substrate, the one or more common electrode lines being arranged at a layer identical to the gate electrode and being of a slit-like shape;
    forming a passivation layer covering the oxide TFT and comprising a SiON layer, the SiON layer at least covering the first region;
    forming a pixel electrode and a common electrode on the passivation layer, the common electrode being connected to the one or more common electrode lines through a first via-hole penetrating through the gate insulation layer and the passivation layer, the pixel electrode being connected to the drain electrode through a second via-hole penetrating through the passivation layer;
    applying a photoresist onto the base substrate with the pixel electrode and the common electrode, and exposing a portion of the photoresist not shielded by the gate electrode from a side of the base substrate away from the oxide TFT;
    developing the photoresist so as to remove the portion of the photoresist not shielded by the gate electrode and reserve a portion of the photoresist shielded by the gate electrode;
    depositing a layer of SiNx, a portion of the first via-hole being filled with the layer of SiNx; and
    removing the remaining photoresist and the layer of SiNx on the remaining photoresist
    forming a SiNx layer only covering the second region.

2. The method according to claim 1, wherein the forming the SiON layer at least covering the first region comprises forming the SiON layer covering both the first region and the second region.

3. The method according to claim 1, wherein prior to the forming the SiNx layer covering the second region, the method further comprises forming the first via-hole having a depth greater than a predetermined threshold in the oxide TFT display substrate, wherein the SiNx layer is filled into the first via-hole in the meantime of forming the SiNx layer covering the second region.

4. The method according to claim 1, wherein the SiNx layer is deposited at a temperature of less than 250° C.

5. An oxide thin film transistor (TFT) display substrate, comprising:
    a first region at least corresponding to a semiconducting region of an oxide TFT and a second region other than the first region;
    a base substrate;
    the oxide TFT and one or more common electrode lines arranged on the base substrate, the oxide TFT including a gate electrode, a gate insulation layer, an active layer, a source electrode and a drain electrode sequentially formed on the base substrate, an orthogonal projection of the active layer onto the base substrate falling within an orthogonal projection of the gate electrode onto the base substrate, the one or more common electrode lines being arranged at a layer identical to the gate electrode and being of a slit-like shape;
    a passivation layer covering the oxide TFT and including a SiON layer;
    the SiON layer arranged on the oxide TFT and at least covering the first region;
    a pixel electrode and a common electrode arranged on the passivation layer, the common electrode being connected to the one or more common electrode lines through a first via-hole penetrating through the gate insulation layer and the passivation layer, the pixel electrode being connected to the drain electrode through a second via-hole penetrating through the passivation layer; and
    a SiNx layer arranged on the passivation layer and covering the second region, an orthogonal projection of the SiNx layer onto the base substrate not overlapping the orthogonal projection of the gate electrode onto the base substrate.

6. The oxide TFT display substrate according to claim 5, wherein the SiON layer covers both the first region and the second region.

7. The oxide TFT display substrate according to claim 5, wherein the first via-hole having a depth greater than a predetermined threshold is formed in the oxide TFT display substrate, and a portion of the first via-hole is filled with the SiNx layer.

8. The oxide TFT display substrate according to claim 5, wherein the passivation layer further comprises a SiOx layer arranged between the oxide TFT and the SiON layer.

9. The oxide TFT display substrate according to claim 5, wherein an organic resin layer made of an organic photosensitive material and having a thickness of about 4000 Å to 30000 Å is coated onto the passivation layer, and then exposed and developed, so as to form a pattern of the passivation layer with the first via-hole and the second via-hole through a single etching process.

10. The oxide TFT display substrate according to claim 9, wherein an organic resin layer having a thickness of about 4000 Å to 30000 Å and made of benzocyclobutene (BCB) is coated onto the passivation layer, and then exposed and developed, so as to form a pattern of the passivation layer with the first via-hole and the second via-hole through a single etching process.

11. A display device, comprising an oxide thin film transistor (TFT) display substrate, wherein the oxide TFT display substrate comprises:

a first region at least corresponding to a semiconducting region of an oxide TFT and a second region other than the first region;

a base substrate;

the oxide TFT and one or more common electrode lines arranged on the base substrate, the oxide TFT including a gate electrode, a gate insulation layer, an active layer, a source electrode and a drain electrode sequentially formed on the base substrate, an orthogonal projection of the active layer onto the base substrate falling within an orthogonal projection of the gate electrode onto the base substrate, the one or more common electrode lines being arranged at a layer identical to the gate electrode and being of a slit-like shape;

a passivation layer covering the oxide TFT and including a SiON layer;

the SiON layer arranged on the oxide TFT and at least covering the first region;

a pixel electrode and a common electrode arranged on the passivation layer, the common electrode being connected to the one or more common electrode lines through the first via-hole penetrating through the gate insulation layer and the passivation layer, the pixel electrode being connected to the drain electrode through a second via-hole penetrating through the passivation layer; and a SiNx layer arranged on the passivation layer and covering the second region, an orthogonal projection of the SiNx layer onto the base substrate not overlapping the orthogonal projection of the gate electrode onto the base substrate.

12. The display device according to claim 11, wherein the SiON layer covers both the first region and the second region.

13. The display device according to claim 11, wherein the first via-hole having a depth greater than a predetermined threshold is formed in the oxide TFT display substrate, and a portion of the first via-hole is filled with the SiNx layer.

14. The display device according to claim 11, wherein the passivation layer further comprises a SiOx layer arranged between the oxide TFT and the SiON layer.

15. The display device according to claim 11, further comprising a flexible circuit board (FCB), a printed circuit board (PCB) and a back plate.

16. The display device according to claim 11, wherein an organic resin layer made of an organic photosensitive material and having a thickness of about 4000 Å to 30000 Å is coated onto the passivation layer, and then exposed and developed, so as to form a pattern of the passivation layer with the first via-hole and the second via-hole through a single etching process.

17. The display device according to claim 16, wherein an organic resin layer having a thickness of about 4000 Å to 30000 Å and made of benzocyclobutene (BCB) is coated onto the passivation layer, and then exposed and developed, so as to form a pattern of the passivation layer with the first via-hole and the second via-hole through a single etching process.

* * * * *